United States Patent
Motomura et al.

(10) Patent No.: US 10,705,275 B2
(45) Date of Patent: Jul. 7, 2020

(54) COMPOSITE FILM AND ORGANIC ELECTROLUMINESCENCE DEVICE

(71) Applicant: FUJIFILM Corporation, Tokyo (JP)

(72) Inventors: Yuya Motomura, Ashigarakami-gun (JP); Kenta Yamazaki, Ashigarakami-gun (JP); Shinichi Morishima, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/429,897

(22) Filed: Jun. 3, 2019

(65) Prior Publication Data

US 2019/0285788 A1    Sep. 19, 2019

Related U.S. Application Data

(63) Continuation of application No. PCT/JP2017/038482, filed on Oct. 25, 2017.

(30) Foreign Application Priority Data

Jan. 31, 2017   (JP) ................................. 2017-016032

(51) Int. Cl.
| | | |
|---|---|---|
| H01L 29/08 | (2006.01) | |
| G02B 5/30 | (2006.01) | |
| H01L 51/52 | (2006.01) | |
| B32B 27/00 | (2006.01) | |
| B32B 9/00 | (2006.01) | |
| H01L 51/50 | (2006.01) | |
| B32B 7/02 | (2019.01) | |
| B32B 27/26 | (2006.01) | |
| H05B 33/04 | (2006.01) | |
| H05B 33/02 | (2006.01) | |

(52) U.S. Cl.
CPC ............. G02B 5/3016 (2013.01); B32B 7/02 (2013.01); B32B 9/00 (2013.01); B32B 27/00 (2013.01); B32B 27/26 (2013.01); H01L 51/50 (2013.01); H01L 51/5281 (2013.01); H05B 33/02 (2013.01); H05B 33/04 (2013.01); *H01L 51/5253* (2013.01); *H01L 2251/5338* (2013.01)

(58) Field of Classification Search
CPC .................................................... G02B 5/3016
USPC .......................................................... 257/40
See application file for complete search history.

(56) References Cited

U.S. PATENT DOCUMENTS

| | | | |
|---|---|---|---|
| 2005/0233168 A1* | 10/2005 | Magno | ................... C09K 11/06 428/690 |
| 2014/0332786 A1 | 11/2014 | Nakazawa | |
| 2015/0099126 A1 | 4/2015 | Honda | |
| 2016/0049614 A1* | 2/2016 | Gao | ...................... G02B 5/3033 257/40 |
| 2016/0118448 A1* | 4/2016 | Epstein | ............... H01L 27/3244 257/40 |
| 2017/0187004 A1* | 6/2017 | Giraldo | ............... H01L 51/5253 |
| 2018/0159085 A1 | 6/2018 | Yoshida | |
| 2018/0284332 A1 | 10/2018 | Murashige et al. | |

FOREIGN PATENT DOCUMENTS

| | | |
|---|---|---|
| JP | 2006-292834 A | 10/2006 |
| JP | 2014-122984 A | 7/2014 |
| JP | 2016-105166 A | 6/2016 |
| WO | WO 2013/077220 A1 | 5/2013 |
| WO | WO 2013/161894 A1 | 10/2013 |
| WO | WO 2016/139981 A1 | 9/2016 |
| WO | WO 2016/194801 A1 | 12/2016 |

OTHER PUBLICATIONS

International Preliminary Report on Patentability and Written Opinion of the International Searching Authority (Forms PCT/IB/326, PCT/IB/373, and PCT/ISA/237) for International Application No. PCT/JP2017/038482, dated Aug. 15, 2019, with English translation.
International Search Report (Form PCT/ISA/210) for International Application No. PCT/JP2017/038482, dated Jan. 23, 2018, with English translation.

* cited by examiner

*Primary Examiner* — Caleb E Henry
(74) *Attorney, Agent, or Firm* — Birch, Stewart, Kolasch & Birch, LLP

(57) ABSTRACT

A composite film includes at least one phase difference layer, a substrate, and an inorganic layer, in which the phase difference layer is a layer formed by curing a composition including a liquid crystal compound, the inorganic layer includes silicon nitride, a distance between the substrate and a surface of the composite film is 60 μm or less, with respect to each of the layers other than the substrate, a product E×t×1 of a modulus of elasticity E in unit of GPa, a thickness t in unit of μm, and a distance 1 from a surface of the substrate to a center of each of the layer in unit of μm satisfies Expression 1, and a total SUM(E×t×1) of E×t×1 of each of the layers other than the substrate satisfies Expression 2, 0.8≤E×t×1 (Expression 1), SUM(E×t×1)≤1500 (Expression 2); and the composite film.

18 Claims, No Drawings

COMPOSITE FILM AND ORGANIC ELECTROLUMINESCENCE DEVICE

CROSS-REFERENCE TO RELATED APPLICATIONS

This application is a Continuation of PCT International Application No. PCT/JP2017/038482, filed on Oct. 25, 2017, which claims priority under 35 U.S.C. § 119(a) to Japanese Patent Application No. 2017-016032, filed on Jan. 31, 2017. Each of the above application(s) is hereby expressly incorporated by reference, in its entirety, into the present application.

BACKGROUND OF THE INVENTION

1. Field of the Invention

The present invention relates to a composite film. More specifically, the present invention relates to a composite film that can be used in an organic electroluminescence device. The present invention also relates to an organic electroluminescence device including the composite film.

2. Description of the Related Art

Since an organic electroluminescent element is vulnerable to moisture, it is necessary to block a very small amount of moisture by sealing the element with a glass layer having barrier properties or the like in order to obtain practical durability. On the other hand, since a metal film is used for a back electrode in an organic electroluminescent element, problems of external light reflection or background reflection arise in a case where the element is applied to a display. As the countermeasure thereof, it is known to provide an antireflection film using a circularly polarizing plate on a viewing side.

For a film used in a display, as a constitution having both barrier properties and antireflection function, JP2016-105166A discloses a circularly polarizing plate for an organic EL device, which comprises a polarizer, a phase difference layer functioning as a λ/4 plate, a barrier layer, and a pressure sensitive adhesive layer having a barrier function in this order. In addition, JP2014-122984A discloses that an optical film including a polarizer and a phase difference layer further includes a layer for preventing surface reflection, and this layer has a water vapor barrier function.

SUMMARY OF THE INVENTION

An organic electroluminescent element which is a thin film and has bendability is applicable to a display having flexibility, and in this case, a film to be provided in an organic electroluminescence device is also required to have flexibility. However, the flexibility of the film described in JP2016-105166A is not sufficiently investigated. In addition, as the film described in JP2014-122984A, a barrier layer having an antireflection function is used. However, since the composition having an antireflection function is limited, sufficient barrier properties cannot be obtained.

An object of the present invention is to provide a composite film having optical functionality, high barrier properties, and excellent flexibility as an optical film that can be used in an organic electroluminescence device. Another object of the present invention is to provide an organic electroluminescence device having flexibility and high durability.

In order to make it possible to provide a film having high barrier properties, the present inventors have attempted to prepare a film including an inorganic layer containing silicon nitride as a barrier layer. However, such a layer tends to be brittle and fragile since the layer is a dense film. In addition, in a case where other layers such as a phase difference layer are laminated with this layer, peeling between the layers or breakage occurs in a case of bending. Therefore, the present inventors have further conducted intensive investigations on the constitution in which such cracking of the barrier layer, peeling between layers, and breakage are not easily occur, and thus completed the present invention.

That is, the present invention provides the following [1] to [12].

[1] A composite film comprising: at least one phase difference layer; a substrate; and an inorganic layer,
in which the phase difference layer is a layer formed by curing a composition including a liquid crystal compound,
the inorganic layer includes silicon nitride,
a distance between the substrate and a surface of the composite film is 60 μm or less, and
with respect to each of the layers other than the substrate, a product E×t×1 of a modulus of elasticity E in unit of GPa, a thickness t in unit of μm, and a distance 1 from a surface of the substrate to a center of the layer in unit of μm satisfies Expression 1, and a total SUM(E×t×1) of E×t×1 of each of the layers other than the substrate satisfies Expression 2.

$$0.8 \leq E \times t \times 1 \qquad \text{Expression 1}$$

$$\mathrm{SUM}(E \times t \times 1) \leq 1500 \qquad \text{Expression 2}$$

[2] The composite film according to [1], further comprising: an organic layer, in which the inorganic layer is in direct contact with the organic layer.

[3] The composite film according to [2], in which the inorganic layer is a layer formed on a surface of the organic layer by a chemical vapor deposition method.

[4] The composite film according to any one of [1] to [3], further comprising: a polarizer layer, in which one phase difference layer and the polarizer layer are adjacent to each other.

[5] The composite film according to [4], in which the polarizer layer includes an organic dichroic dye.

[6] The composite film according to any one of [1] to [5], further comprising: a λ/2 layer; and a λ/4 layer, in which the λ/2 layer and the λ/4 layer are adjacent to each other.

[7] The composite film according to any one of [1] to [6], in which the liquid crystal compound is a disk-like liquid crystal compound.

[8] The composite film according to any one of [1] to [7], in which the substrate is a cycloolefin polymer film.

[9] The composite film according to any one of [1] to [8], in which the at least one phase difference layer, the substrate, and the inorganic layer are arranged in this order.

[10] The composite film according to any one of [1] to [8], in which the at least one phase difference layer, the inorganic layer, and the substrate are arranged in this order.

[11] An organic electroluminescence device comprising: the composite film according to any one of [1] to [8], and an organic electroluminescent element,
in which the at least one phase difference layer, the substrate, the inorganic layer, and an organic electroluminescent element are arranged in this order.

[12] An organic electroluminescence device comprising: the composite film according to any one of [1] to [8], in which the substrate, the inorganic layer, the at least one phase difference layer, and an organic electroluminescent element are arranged in this order.

According to the present invention, it is possible to provide a composite film having optical functionality, high barrier properties, and excellent flexibility. In addition, it is possible to prepare an organic electroluminescence device having flexibility and high durability using the composite film of the present invention.

DESCRIPTION OF THE PREFERRED EMBODIMENTS

Hereinafter, the contents of the present invention will be described in detail.

Although the description below will be made based on representative embodiments of the present invention, the present invention is not limited to these embodiments.

In the present specification, "to" is used to mean that numerical values described before and after "to" are included in a numerical range as a lower limit value and an upper limit value.

In the present specification, for example, unless specified otherwise, an angle such as "45°", "parallel", or "perpendicular" means that a difference from the exact angle is in a range less than 5°. The difference from the exact angle is preferably less than 4° and more preferably less than 3°.

In the present specification, "(meth)acrylate" represents "either or both of acrylate and methacrylate". The same shall be applied to "(meth)acryloyl group" and the like.

In the present specification, the modulus of elasticity is a value measured using a nanoindentation method or a picosecond ultrasonic method. Particularly, the modulus of elasticity of an inorganic layer is preferably measured using a picosecond ultrasonic method.

The nanoindentation method can be performed by, for example, using a diamond cube corner indenter (having a curvature radius of 150 nm) or the like in a nanoindentation apparatus manufactured by Hysitron Inc.

The picosecond ultrasonic method can be performed in the following procedure with reference to the reference document: OPTICS LETTERS, Vol. 24, p. 1305 (1999). First, a 20 nm Al film for generating ultrasonic waves is formed on a sample surface. Next, excitation light is made incident on the Al film to generate ultrasonic waves on the surface of the Al film. The ultrasonic waves propagate in the film in the film thickness depth direction, are reflected at the laminated interface, and return to the surface again. The time during this period is measured with an optical interferometer for ultra high speed measurement described in the reference document and a sound speed c is obtained from the film thickness to calculate a modulus of elasticity by the following expression (however, $\rho=3440$ kg/m$^3$, Poisson's ratio $v=0.3$).

$$E = \rho c^2 \frac{(1+v)(1-2v)}{(1-v)}$$

Regarding the modulus of elasticity of a layer, the modulus of elasticity of a film-like single layer that can be taken out as an independent film is measured and the modulus of elasticity of a layer that cannot be taken out as an independent film is measured in a state of being formed on a substrate. Here, as the substrate, a glass substrate or various plastic films can be used.

In the present specification, the thickness is a value measured using a micrometer or a scanning electron microscope. The thickness of a layer may be measured using a micrometer in a case where the thickness of the layer is 10 μm or more and the thickness may be measured by cutting out a cross section and performing measurement using a scanning electron microscope in a case where the thickness is less than 10 μm.

In the present specification, the term "phase difference" used herein means in-plane retardation. Re($\lambda$) represents an in-plane retardation at a wavelength of $\lambda$ nm. As Re($\lambda$), a value measured by making light having a wavelength of $\lambda$ nm incident on a film in the normal direction of the film in KOBRA 21ADH or WR (manufactured by Oji Scientific Instruments) can be used. In the selection of the measurement wavelength, a wavelength selective filter can be manually replaced, or the measured value can be converted by using a program or the like.

<<Composite Film>>

In the present specification, the term "composite film" is a laminated film including a plurality of layers and means a film having optical functionality. Barrier properties refer to a function of blocking moisture (water vapor). A composite film according to an embodiment of the present invention preferably blocks gas such as oxygen. The optical functionality includes birefringence, light reflection properties, anti-reflective properties, polarization state controllability, and the like.

The composite film according to the embodiment of the present invention includes at least one phase difference layer, a substrate, and an inorganic layer. These layers are preferably provided such that the phase difference layer, the substrate, and the inorganic layer are arranged in this order or the phase difference layer, the inorganic layer, and the substrate are arranged in this order.

The composite film according to the embodiment of the present invention preferably further includes an organic layer and also preferably further includes a polarizer layer. The composite film according to the embodiment of the present invention may include an alignment film. The composite film according to the embodiment of the present invention may include layers other than the above layers.

In the composite film according to the embodiment of the present invention, a distance between the substrate and the surface of the composite film is 60 μm or less. Here, the surface of the composite film means each of both surfaces of the composite film (front and rear surfaces). That is, the distances between the substrate and both two surfaces of the composite film are 60 μm or less. The distance between the substrate and the surface of the composite film means a distance between the surface and a surface of the corresponding surface side of the substrate (a surface closer to the corresponding surface). The distance between the substrate and the surface of the composite film typically corresponds to the total thickness of layers (including an alignment film, a layer formed by an adhesive composition, and the like) laminated on the face side of the substrate. That is, for example, in a case where a layer having a thickness of $t_1$ μm and a layer having a thickness of $t_2$ μm are laminated on one side of the substrate, a distance between the surface obtained by the lamination and the substrate is $(t_1+t_2)$ μm. In addition, in a case where a layer having a thickness of $t_3$ μm is laminated on one side of the substrate with a layer formed using an adhesive composition having a thickness of d μm interposed therebetween, a distance between the surface obtained by the lamination and the substrate is $(d+t_3)$ μm.

The distance between the substrate and the surface of the composite film is preferably 30 μm or less and more preferably 15 μm or less.

In the composite film according to the embodiment of the present invention, with respect to each of the layers other than the substrate, a product E×t×l of a modulus of elasticity E (GPa), a thickness t (μm), and a distance l (μm) between the surface of the substrate to the center of the layer satisfies Expression 1 and a total SUM(E×t×l) of E×t×l of each of the layers other than the substrate satisfies Expression 2.

$$0.8 \leq E \times t \times l \quad \text{Expression 1}$$

$$\text{SUM}(E \times t \times l) \leq 1500 \quad \text{Expression 2}$$

The present inventors have conducted intensive investigations on the constitution having flexibility and barrier properties in a case where these layers used in the composite film are combined in consideration that the plurality of layers used in the composite film have a wide range of modulus of elasticity (for example, 0.001 GPa to 100 GPa) depending on the material, and as a result, have found that in a case where the modulus of elasticity and the thickness of each layer, and the distance to the substrate are formed so as to satisfy Expressions 1 and 2, a composite film having flexibility and barrier properties is obtained.

In the present specification, the term "the center of the layer" means the center of the layer in the thickness direction. The distance l (μm) from the surface of the substrate to the center of the layer is obtained by adding the total thickness of layers (including an alignment film, a layer formed using an adhesive composition, and the like) between the layer and the substrate to a half of the thickness of the layer. That is, in a case where a layer having a thickness of $t_1$ μm and a layer having a thickness of $t_2$ μm are laminated on the substrate in this order from the substrate side, the distance l of the layer having a thickness of $t_1$ μm is $t_1/2$, and the distance l of the layer having a thickness of $t_2$ μm is $t_1+t_2/2$. In addition, in a case where a layer having a thickness of $t_3$ μm is laminated on the substrate with a layer formed using an adhesive composition having a thickness of d μm interposed therebetween, the distance l of the layer having a thickness of $t_3$ μm is $d+t_3/2$.

Expression 1 shows that the minimum value of values of E×t×l of each of the layers other than the substrate is 0.8 or more. The minimum value of E×t×l is preferably 0.8 to 50 and more preferably 0.8 to 20. The value of E×t×l is preferably 0.8 to 300 and more preferably 0.8 to 100.

The value of SUM(E×t×l) is preferably 1 to 1500 and more preferably 20 to 300.

The layer satisfying Expression 1 and having the value of E×t×l satisfying Expression 2 is each of the layers other than the substrate. In addition, the substrate preferably has a value of E×t×l satisfying Expression 2.

The layers other than the substrate included in the composite film according to the embodiment of the present invention are the phase difference layer and the inorganic layer, and additionally included layers include an organic layer, a polarizer layer, a surface antireflection layer, an antifouling layer, a hard coat layer, an antibacterial layer, and the like. Regarding a layer constituted of a plurality of layers, each layer satisfies Expression 1 and has a value of E×t×l satisfying Expression 2. For example, in a case where the composite film according to the embodiment of the present invention includes a λ/4 layer and a λ/2 layer as a phase difference layer, each of the λ/4 layer and the λ/2 layer satisfies Expression 1 and has a value of E×t×l satisfying Expression 2. An adhesive composition for lamination of each layer or an alignment film for formation of a phase difference layer or the like generally forms a layer but is not included in the "layers other than the substrate" used herein. The layer may not satisfy Expression 1 and is not considered in Expression 2.

The layer satisfying Expression 1 and having a value of E×t×l satisfying Expression 2 may be a layer having the finally required function only in itself. For example, an adhesive layer is an auxiliary layer provided for lamination, an alignment film is an auxiliary layer provided for formation of a phase difference layer, and the adhesive layer and the alignment film are not included in the layer having the finally required function.

The thickness of the composite film may be 1 μm to 200 μm and is preferably 10 μm to 130 μm.

<Substrate>

In the composite film according to the embodiment of the present invention, the substrate has a function as a support for layers other than the substrate. The substrate is preferably a support for, particularly, the inorganic layer or a barrier laminate described later, and is preferably a substrate in a case where the inorganic layer or the barrier laminate is formed.

The thickness of the substrate is preferably 1.0 μm to 200 μm and more preferably 10 μm to 130 μm.

The modulus of elasticity of the substrate is preferably 0.01 GPa to 100 GPa and more preferably 0.1 GPa to 50 GPa.

The material of the substrate used in the present invention is not particularly limited and various resin films can be used. Examples thereof include resins having transparency such as a cellulose-based resin such as triacetyl cellulose, a polyester-based resin such as polyethylene terephthalate or polyethylene naphthalate, a polyvinyl alcohol-based resin, a vinyl butyral-based resin, a polyvinyl acetal-based resin, a polycarbonate-based resin, a polyamide-based resin such as nylon or aromatic polyamide, a polyimide-based resin, polyether sulfone-based resin, a polyether-based resin, a polysulfone-based resin, a polyether ether ketone-based resin, a polyphenylene sulfide-based resin, a vinylidene chloride-based resin, a polystyrene-based resin such as polystyrene or an acrylonitrile/styrene copolymer, a cycloolefin polymer (COP) typified by a dicyclopentadiene ring-opened polymer hydride, a cycloolefin copolymer (COC) typified by a copolymer of dicyclopentadiene and ethylene or a hydride thereof, a cyclic olefin-based resin such as a norbornene-based polymer, a polyolefin-based resin such as polyethylene, polypropylene, or a copolymer of ethylene and propylene, an acrylic resin such as polymethyl methacrylate, a urethane-based resin, an acrylic urethane-based resin, an acetate-based resin, a vinyl chloride-based resin, an acrylate-based resin, a polyoxymethylene-based resin, an epoxy-based resin, and a mixture thereof. As the material of the substrate, a cycloolefin polymer is preferable.

In a case where the composite film according to the embodiment of the present invention is used in an organic electroluminescence device, when the composite film is arranged closer to the viewing side than the phase difference layer, a polyester-based resin, COP, COC, a cyclic olefin-based resin, and a polycarbonate-based resin are preferably used for the substrate, and in a case where the composite film is arranged closer to the organic EL element than the phase difference layer, COP, COC, a cyclic olefin-based resin, and a polycarbonate-based resin are preferably used for the substrate.

<Inorganic Layer>

The inorganic layer includes a metal compound. The inorganic layer may be a layer mainly contributing to the barrier properties of the composite film.

The amount of the metal compound in the inorganic layer may be 90% by mass or more with respect to the total mass of the inorganic layer, is preferably 95% by mass or more, more preferably 99% by mass or more, and even more preferably 99.9% by mass or more. The inorganic layer may be substantially formed of a metal compound.

The metal compound include a metal oxide, a metal nitride, a metal carbide, a metal oxynitride, and a metal oxycarbide. For example, as the metal compound, an oxide, a nitride, a carbide, an oxynitride, and an oxycarbide containing one or more metals selected from Si, Al, In, Sn, Zn, Ti, Cu, Ce, and Ta can be preferably used. Among these, an oxide, a nitride or an oxynitride of a metal selected from Si, Al, In, Sn, Zn, and Ti is preferable, particularly, an oxide of Si, a nitride of Si, an oxynitride of Si, an oxide of Al, a nitride of Al, or an oxynitride of Al is preferable. These metal compounds may contain another element as a subcomponent. For example, the metal compound may contain hydrogen. In addition, the metal compound may be a nitride having a hydroxyl group or the like.

As the inorganic layer, particularly, layers including Si are preferable. This is because the inorganic layers have higher transparency and further excellent barrier properties. Among these, a layer including silicon nitride is particularly preferable.

The composite film according to the embodiment of the present invention includes at least one layer including silicon nitride as the inorganic layer. In the layer including silicon nitride, the amount of silicon nitride is preferably 60% by mass or more, more preferably 70% by mass or more, even more preferably 80% by mass or more, and particularly preferably 90% by mass or more with respect to the total mass of the layer including silicon nitride.

In a case where the composite film according to the embodiment of the present invention includes a plurality of inorganic layers, the metal compounds constituting the plurality of inorganic layers may be the same as or different from each other but are preferably the same. That is, in a case where the composite film according to the embodiment of the present invention includes a plurality of inorganic layers, all of the plurality of inorganic layers are preferably layers including silicon nitride.

For example, the inorganic layer may include hydrogen since an oxide, a nitride, or an oxynitride of a metal contains hydrogen. However, the hydrogen concentration in Rutherford forward scattering is preferably 30% or less.

The smoothness of the inorganic layer formed by the present invention is preferably less than 3 nm and more preferably 1 nm or less as an average roughness in 1 µm square (Ra value).

As a method of forming the inorganic layer, any method can be used as long as a thin film can be formed. Examples of the method of forming the inorganic layer include physical vapor deposition methods (PVD) such as a vapor deposition method, a sputtering method and an ion plating method, various chemical vapor deposition methods (CVD) such as thermal CVD, photo CVD, and plasma CVD, and liquid phase growth methods such as plating and a sol-gel method. In a case where the composite film according to the embodiment of the present invention includes a plurality of inorganic layers, the methods of forming the plurality of inorganic layers may be the same as or different from each other, but are preferably the same.

The inorganic layer is preferably formed directly on the substrate or on the surface of an organic layer described later.

The thickness of the inorganic layer is not particularly limited. Typically, the thickness of the single inorganic layer is in a range of 5 to 500 nm, preferably 10 to 200 nm, and more preferably 15 to 50 nm.

[Barrier Laminate]

The inorganic layer may be included in the composite film according to the embodiment of the present invention as a layer constituting the barrier laminate.

In the present specification, the barrier laminate means a laminate including at least one inorganic layer and at least one organic layer. The barrier laminate may include the substrate or may not include the substrate.

The barrier laminate may be a laminate formed by alternately laminating two or more organic layers and two or more inorganic layers.

The number of layers constituting the barrier laminate is not particularly limited and is typically preferably 2 to 30 and more preferably 3 to 20.

Preferable examples of the barrier laminate include barrier laminates respectively having configurations having, in the following orders from the substrate side in the composite film: an organic layer and an inorganic layer; an inorganic layer, an organic layer, and an inorganic layer; an organic layer, an inorganic layer, and an organic layer; an organic layer, an inorganic layer, an organic layer, and an inorganic layer; an inorganic layer, an organic layer, an inorganic layer, an organic layer, and an inorganic layer; and an organic layer, an inorganic layer, an organic layer, an inorganic layer, and an organic layer.

The layer closest to the substrate in the barrier laminate is preferably formed directly on the surface of the substrate.

In addition, the barrier laminate may include constitutional layers other than the organic layer and the inorganic layer.

The thickness of the barrier laminate is preferably 0.5 µm to 15 µm and more preferably 1 µm to 10 µm.

The barrier laminate may include a so-called gradient material layer in which a continuous change of an organic region and an inorganic region in the composition constituting the barrier laminate in the thickness direction is generated, within the range not departing from the gist of the present invention. Particularly, a gradient material layer between a specific organic layer and an inorganic layer formed directly on the surface of the organic layer may be included. Examples of the gradient material layer include materials described in "Journal of Vacuum Science and Technology A, Vol. 23, p 971-977, by Kim et al., (2005 American Vacuum Society) and a continuous layer in which an organic region and an inorganic region has no interface described in US2004/0046497A. Hereinafter, in order to simplify the description, the organic layer and the organic region will be referred to as "organic layer", and the inorganic layer and the inorganic region will be referred to as "inorganic layer".

(Organic Layer)

The barrier laminate includes at least one organic layer. In the barrier laminate, the organic layer is preferably in direct contact with at least one inorganic layer.

The organic layer can be preferably formed by curing a polymerizable composition including a polymerizable compound.

(Polymerizable Compound)

The polymerizable compound is preferably a compound having an ethylenically unsaturated bond at a terminal or a side chain, and/or a compound having epoxy or oxetane at a terminal or a side chain. It is particularly preferable that the polymerizable compound is a compound having an ethylenically unsaturated bond at a terminal or a side chain. Examples of the compound having an ethylenically unsaturated bond at a terminal or a side chain include a (meth)acrylate-based compound, an acrylamide-based compound, a styrene-based compound, and maleic acid anhydride. Among these, a (meth)acrylate-based compound is preferable, and an acrylate-based compound is particularly preferable.

As the (meth)acrylate-based compound, for example, (meth)acrylate, urethane (meth)acrylate, polyester (meth)acrylate, epoxy (meth)acrylate, or the like is preferable.

As the styrene-based compound, styrene, ca-methylstyrene, 4-methylstyrene, divinylbenzene, 4-hydroxystyrene, 4-carboxystyrene, or the like is preferable.

As the (meth)acrylate-based compound, specifically, for example, compounds described in paragraphs 0024 to 0036 of JP2013-043382A or paragraphs 0036 to 0048 of JP2013-043384A can be used. In addition, polyfunctional acrylic monomers having a fluorene skeleton such as a compound represented by Formula (2) described in WO2013/047524 can be used.

(Polymerization Initiator)

The polymerizable composition for forming an organic layer may include a polymerization initiator. In a case of using a polymerization initiator, the content thereof is preferably 0.1% by mole or more, and more preferably 0.5% to 5% by mole of the total amount of the compounds involved in polymerization. By adopting such a composition, a polymerization reaction via an active component generation reaction can be appropriately controlled. Examples of photopolymerization initiators include Irgacure series (for example, IRGACURE 651, IRGACURE 754, IRGACURE 184, IRGACURE 2959, IRGACURE 907, IRGACURE 369, IRGACURE 379, and IRGACURE 819), Darocure series (for example, DAROCURE TPO and DAROCURE 1173), and Quantacure PDO, all commercially available from BASF SE, and Esacure series (for example, ESACURE TZM, ESACURE TZT, and ESACURE KT046) all commercially available from Lamberti S.p.A.

(Silane Coupling Agent)

The polymerizable composition for forming an organic layer may include a silane coupling agent. The silane coupling agent preferably has a hydrolyzable reactive group such as a methoxy group, an ethoxy group, or an acetoxy group, which is to be bonded to silicon, and a substituent which has one or more reactive groups selected from an epoxy group, a vinyl group, an amino group, a halogen group, a mercapto group, and a (meth)acryloyl group, as a substituent which is bonded to the same silicon. The silane coupling agent particularly preferably has a (meth)acryloyl group. Specific examples of the silane coupling agent include a silane coupling agent represented by Formula (1) described in WO2013/146069 and a silane coupling agent represented by Formula (I) described in WO2013/027786.

The proportion of the silane coupling agent in the solid content of the polymerizable composition (residue after a volatile content is volatilized) is preferably 0.1% to 30% by mass and more preferably 1% to 20% by mass.

(Method of Preparing Organic Layer)

In order to prepare the organic layer, first, the polymerizable composition is applied in the form of layer. In order to apply the composition in the form of layer, typically, the polymerizable composition may be applied to the substrate or the support of the inorganic layer. Examples of the method for application include a dip coating method, an air knife coating method, a curtain coating method, a roller coating method, a wire bar coating method, a gravure coating method, a slide coating method, or an extrusion coating method (also referred to as a die coating method) using a hopper described in U.S. Pat. No. 2,681,294A and among these, an extrusion coating method can be preferably adopted.

In a case where the polymerizable composition for forming an organic layer is applied to the surface of the inorganic layer, the polymerizable composition is preferably applied using an extrusion coating method.

Then, the applied polymerizable composition may be dried.

The polymerizable composition may be cured using light (such as ultraviolet rays), electron beams, or heat rays and is preferably cured by light. Particularly, it is preferable that while the polymerizable composition is being heated at a temperature of 25° C. or higher (for example, 30° C. to 130° C.), the composition is cured. By promoting the free motion of the polymerizable composition by heating, the polymerizable composition can be effectively cured, and the film can be formed without damaging the substrate film or the like.

As the light for irradiation, ultraviolet rays from a high pressure mercury lamp or a low pressure mercury lamp are preferable. The irradiation energy is preferably 0.1 J/cm$^2$ or more and more preferably 0.5 J/cm$^2$ or more. It is preferable to reduce an oxygen concentration or oxygen partial pressure in the polymerization since the polymerizable compound suffers polymerization inhibition by oxygen in the air. In a case of reducing the oxygen concentration at the time of the polymerization by a nitrogen substitution method, the oxygen concentration is preferably 2% or less and more preferably 0.5% or less. In a case where the oxygen partial pressure at the time of the polymerization is reduced by a pressure reducing method, the total pressure is preferably 1000 Pa or less and more preferably 100 Pa or less. In addition, it is particularly preferable to perform ultraviolet polymerization by irradiation with an energy of 0.5 J/cm$^2$ or more under the reduced pressure condition of 100 Pa or less.

The polymerization rate of the polymerizable compound in the polymerizable composition after curing is preferably 20% or more, more preferably 30% or more, and particularly preferably 50% or more. The polymerization rate denoted here means a proportion of reacted polymerizable groups among all the polymerizable groups (such as acryloyl group and methacryloyl group) in the monomer mixture. The polymerization rate can be determined quantitatively using an infrared absorption method.

It is preferable that the organic layer is smooth and has a high film hardness. The smoothness of the organic layer is preferably less than 3 nm and more preferably less than 1 nm as average roughness in 1 μm square (Ra value).

It is required that foreign matter such as particles and protrusions are not present on the surface of the organic layer. Therefore, it is preferable that the organic layer is formed in a clean room. The degree of cleanliness is preferably class 10000 or lower and more preferably class 1000 or lower.

It is preferable that the hardness of the organic layer is high. In a case where the hardness of the organic layer is high, a smooth inorganic layer is formed. As a result, it is found that the barrier properties are improved. The hardness of the organic layer can be denoted as a microhardness based on the nanoindentation method. The microhardness of the organic layer is preferably 100 N/mm or higher and more preferably 150 N/mm or higher.

The thickness of the organic layer is not particularly limited but from the viewpoint of brittleness and light transmittance, the thickness is preferably 50 nm to 5000 nm and more preferably 100 nm to 3500 nm.

(Lamination of Organic Layer and Inorganic Layer)

Lamination of an organic layer and an inorganic layer can be conducted by successively and repeatedly forming an organic layer and an inorganic layer based on a desired layer constitution.

<Phase Difference Layer>

The phase difference layer is a layer having a phase difference. In the composite film according to the embodiment of the present invention, the phase difference layer is a layer formed by curing a composition including a liquid crystal compound. That is, the phase difference layer is a layer exhibiting optical anisotropy exerted based on alignment of molecules of the liquid crystal compound.

Examples of the liquid crystal compound used for formation of the phase difference layer include a liquid crystal compound having forward wavelength dispersibility, in which the phase difference is larger on a short wavelength side than on a long wavelength side, and a liquid crystal compound having reverse wavelength dispersibility, in which the phase difference is larger a long wavelength side than on a short wavelength side in contrast. Examples of the liquid crystal compounds include compounds described in paragraphs 0041 to 0105 of JP2015-038598A and compounds described in JP2010-522892A.

The phase difference layer is preferably, for example, a $\lambda/2$ layer or $\lambda/4$ layer. Particularly, in a case of using a liquid crystal compound having forward wavelength dispersibility for the phase difference layer, it is preferable to include both $\lambda/2$ layer and a $\lambda/4$ layer. In addition, in a case of using a liquid crystal compound having reverse wavelength dispersibility for the phase difference layer, it is preferable to use $\lambda/4$ layer alone. It is more preferable to provide a positive C-plate in addition to $\lambda/4$ layer. The positive C-plate allows the optical properties in the oblique direction to approach the optical properties in the front direction, and the optical properties are improved. With regard to the positive C-plate, the descriptions of paragraph 0041 of JP2015-069156A, paragraph 0084 of JP2016-053709A, and JP4592005B can be referred to.

The liquid crystal compound used for formation of the phase difference layer may be a rod-like liquid crystal compound or a disk-like liquid crystal compound. Particularly, in a case of having forward wavelength dispersibility, it is more preferable to use a combination of a disk-like liquid crystal compound and a disk-like liquid crystal compound or a combination of a disk-like liquid crystal compound and a rod-like liquid crystal compound in two phase difference layers of $\lambda/2$ layer and $\lambda/4$ layer. The liquid crystal compound is preferably a polymerizable liquid crystal compound. Examples of the liquid crystal compound include compounds described in paragraphs 0041 to 0105 of JP2015-038598A.

The composition including the liquid crystal compound may include, in addition to the liquid crystal compound, a polymerization initiator, a leveling agent, a surfactant, a chiral agent, and the like if required.

For the composition including a liquid crystal compound and the method of forming the phase difference layer, the description in paragraphs 0036 to 0112 of JP2015-038598A can be referred to.

The thickness of the phase difference layer is not particularly limited and is preferably 0.2 µm to 10 µm, more preferably 0.5 µm to 5.0 µm, and even more preferably 1.0 µm to 2.0 µm. In a case where two or more phase difference layers are included, the total thickness of the two or more phase difference layers is preferably in the above range.

($\lambda/4$ Layer)

The $\lambda/4$ layer used in the present invention is an optically anisotropic layer having a $\lambda/4$ function. The $\lambda/4$ function means that Re($\lambda$) satisfies "Re($\lambda$)=$\lambda/4$". This expression may be achieved at any wavelength in the visible light range (for example, 550 nm), but Re(550) is preferably 115 nm to 155 nm, and more preferably 120 nm to 145 nm. Within this range, since the light leakage of the reflected light in a case of combination with the $\lambda/2$ layer described later can be reduced to the extent that the light leakage is not visually recognized, this range is preferable.

($\lambda/2$ Layer)

The $\lambda/2$ layer used in the present invention is an optically anisotropic layer having a $\lambda/2$ function. The $\lambda/2$ function means that Re($\lambda$) satisfies "Re($\lambda$)=$\lambda/2$". This expression may be achieved at any wavelength in the visible light range (for example, 550 nm), but Re(550) is preferably 230 nm to 310 nm and more preferably 240 nm to 290 nm.

In a case where the composite film according to the embodiment of the present invention includes both the $\lambda/2$ layer and the $\lambda/4$ layer, an in-plane retardation Re1 of the $\lambda/2$ layer is set to be substantially twice an in-plane retardation Re2 of the $\lambda/4$ layer. Here, the expression "retardation is set to be substantially twice" means that "Re1=2×Re2±50 nm". Here, it is more preferable that "Re1=2×Re2±20 nm" is satisfied and it is even more preferable that "Re1=2×Re2±10 nm" is satisfied. This expression may be achieved at any wavelength in the visible light range, but is preferably achieved at a wavelength of 550 nm. Within this range, since the light leakage of the reflected light in a case of combination with the $\lambda/4$ layer can be reduced to the extent that the light leakage is not visually recognized, this range is preferable.

<Alignment Film>

In a case of forming the phase difference layer, an alignment film may be used to bring the molecules of the liquid crystal compound in the composition into a desired alignment state. The alignment film may be a rubbed film formed of an organic compound such as a polymer, an oblique deposition film of an inorganic compound, a film having a microgroove, or an accumulated film (LB film) of an organic compound such as co-tricosanoic acid, dioctadecyl methyl ammonium chloride, or methyl stearate using a Langmuir-Blodgett method. Further, there is an alignment film in which an alignment function is generated through application of light. An alignment film formed by performing a rubbing treatment on the surface of a polymer layer is preferable. The rubbing treatment is performed by rubbing the surface of a polymer layer using paper or cloth several times in a predetermined direction. As the kind of the polymer used for the alignment film, polyimide, polyvinyl alcohol, and polymers having a polymerizable group described in JP1997-152509A (JP-H09-152509A) can be preferably used. It is also preferable to provide a photo alignment film as the alignment film. The photo alignment film is not particularly limited and polymer materials such as the polyamide compounds and the polyimide compounds described in paragraphs 0024 to 0043 of WO2005/096041A, the liquid crystal alignment films formed using a liquid crystal aligning agent having a photo-aligned group described in JP2012-155308A, and product LPP-JP265CP manufactured by Rolic Technologies Ltd. can be randomly used.

The thickness of the alignment film is not particularly limited as long as the alignment function can be provided. For example, the thickness of the alignment film is preferably 0.01 μm to 5 μm and more preferably 0.05 μm to 2 μm.

The modulus of elasticity of the alignment film is preferably 0.01 GPa to 100 GPa and more preferably 0.1 GPa to 50 GPa.

As described above, the alignment film may not satisfy Expression 1 or may not have the value of E×t×1 satisfying Expression 2. However, the alignment film may satisfy Expression 1 or may have the value of E×t×1 satisfying Expression 2.

<Polarizer Layer>

The polarizer layer may be a so-called linear polarizing film having a function of converting natural light into a specific linearly polarized light. The polarizer layer is not particularly limited and an absorption type polarizer can be used.

The kind of the polarizer layer is not particularly limited and a typically used polarizing film can be used. For example, any of an iodine-based polarizing film, a dye-based polarizing film using a dichroic dye, a polyene-based polarizing film, and a polarizer using a wire grid can be used. In general, an iodine-based polarizing film and a dye-based polarizing film are prepared by adsorbing an iodine or dichroic dye to polyvinyl alcohol and stretching the polyvinyl alcohol.

In addition, as the polarizer layer used in the present invention, a coating type polarizing film prepared by a method including a coating step using thermotropic liquid crystals and a dichroic dye, a thermotropic liquid crystal dichroic dye or a lyotropic liquid crystal dichroic dye is preferably used. By using the coating type polarizing film, thickness reduction can be further realized for the polarizing film obtained by stretching polyvinyl alcohol. In addition, even in a case where an external force such as bending is applied, it is possible to provide a polarizing plate with a small change in optical properties. Further, it is also possible to provide a polarizing plate having excellent durability and light resistance. The thickness of the above-described coating type polarizing film may be 250 nm or more and is preferably 350 nm or more and more preferably 450 nm or more. In addition, the thickness is preferably 4000 nm or less and more preferably 2000 nm or less.

The coating type polarizing film prepared from the thermotropic liquid crystals and the dichroic dye described above is called a guest-host type coating type polarizing film and is formed of at least one kind of non-coloring host liquid crystal compound, and at least one kind of guest dichroic dye composition. In a case where the non-coloring host liquid crystal compound is a low molecular weight liquid crystal compound, the liquid crystal compound preferably has at least one or more kinds of polymerizable groups, preferably has a rod-like nematic or smectic liquid crystal, and more preferably has a smectic B liquid crystal. In addition, an aspect that the non-coloring host liquid crystal compound is a polymer liquid crystal compound is also preferable. In the guest host composition, the proportion of the dichroic dye is preferably 60% by mass or less, more preferably 40% by mass or less, and particularly preferably 20% by mass or less. Examples of the above-mentioned guest-host type coating type polarizing film include coating type polarizing films described in JP04719156B and JP05566178B.

The coating type polarizing film prepared from the thermotropic liquid crystal dichroic dye described above is formed from a dichroic dye composition including at least one kind of thermotropic liquid crystal dichroic dye. The proportion of the non-coloring liquid crystal compound in the dichroic dye composition is preferably 30% by mass or less. Examples of the above-mentioned thermotropic liquid crystal dichroic dye include thermotropic liquid crystal dichroic dyes used for the light absorbing anisotropic film described in JP05566178B and the like.

The coating type polarizing film prepared from the above-mentioned lyotropic liquid crystal dichroic dye is formed from a dichroic dye composition including at least one kind of lyotropic liquid crystal dichroic dye. The proportion of the non-coloring liquid crystal compound in the dichroic dye composition is preferably 30% by mass or less. Examples of the above-mentioned lyotropic liquid crystal dichroic dye include lyotropic liquid crystal dichroic dyes used in the light absorbing anisotropic film described in JP2006-003864A.

<Optical Functional Film>

In the present specification, the phase difference layer, the polarizer layer, or the laminate including the phase difference layer and the polarizer layer may be referred to as an optical functional film.

The laminate including the phase difference layer and the polarizer layer can be used as an antireflection layer. In an image display device, in a case where external light is inserted into the screen, reflected light is generated and an image is not easily viewed. Particularly, in an organic electroluminescence device, this tendency is strong because a metal electrode is used. Since the reflected light from the metal electrode or the like can be prevented from reaching the viewing side by using a polarizing plate and a phase difference plate, it is possible to impart an antireflection function to the composite film according to the embodiment of the present invention by using the laminate including the phase difference layer and the polarizer layer. In an image display device, the phase difference layer and the polarizer layer may be arranged in the order of the polarizer layer and the phase difference layer from the image display side (viewing side).

In a case where the laminate including the phase difference layer and the polarizer layer is used as an antireflection layer, it is preferable that the composite film according to the embodiment of the present invention includes a λ/2 layer and a λ/4 layer as phase difference layers. This is because in a case of using the combination of the laminate of the λ/2 layer and the λ/4 layer and the polarizer layer as an antireflection layer, the antireflection function is particularly excellent. The λ/2 layer and the λ/4 layer may be provided such that the λ/2 layer and the λ/4 layer are arranged in this order from the image display side (viewing side). It is preferable that these phase difference layers are arranged such that the slow axis of the λ/2 layer is set to form 15° counterclockwise with respect to the absorption axis of a polarizer having linear polarization as viewed from the viewing side and the slow axis of the λ/4 layer is set to form 75° counterclockwise. Depending on the allowable values of the alignment properties and the antireflective properties of the liquid crystal material to be used, the angle may be set to 13° to 17°, and 73° to 77°, and if allowed more, the angle may be set to 10° to 20° and 70° to 80°.

In a case of using only the λ/4 layer as the phase difference layer, it is preferable to set the slow axis of the λ/4 layer to form 45° counterclockwise with respect to the absorption axis of the polarizer having linear polarization as viewed from the viewing side. Depending on the allowable values of the alignment properties and the antireflective properties of the liquid crystal material to be used, the angle may be set to 43° to 47°, and if allowed more, the may be set to 40° to 50°.

<Other Layers>

The composite film according to the embodiment of the present invention may include layers other than the above layers.

Other layers include a surface antireflection layer, an antifouling layer, a hard coat layer, an antibacterial layer, and the like. All of these layers are preferably arranged on the side of the substrate opposite to the inorganic layer, and are more preferably provided on the outermost surface of the substrate opposite to the inorganic layer.

<Adhesive Composition for Lamination of Each Layer>

From the viewpoint of a curing method, the adhesive composition includes a hot melt type adhesive composition, a thermosetting type adhesive composition, a photocuring type adhesive composition, a reaction curing type adhesive composition, and a pressure sensitive adhesion type adhesive composition not requiring curing. As respective materials, acrylate-based, urethane-based, urethane acrylate-based, epoxy-based, epoxy acrylate-based, polyolefin-based, modified olefin-based, polypropylene-based, ethylene vinyl alcohol-based, vinyl chloride-based, chloroprene rubber-based, cyanoacrylate-based, polyamide-based, polyimide-based, polystyrene-based, and polyvinyl butyral-based compounds can be used. From viewpoint of workability and productivity, in consideration of the curing method, a photocuring type, particularly an ultraviolet curing type is preferable, and from viewpoint of optical transparency and heat resistance, the acrylate-based, urethane acrylate-based, and epoxy acrylate-based compounds are preferably used as the material.

The adhesive composition layer may be an optically clear adhesive tape (OCA tape). As the optically clear adhesive tape, a commercially available product for an image display device, particularly, a commercially available product for a surface of an image display unit of an image display device may be used. Examples of commercially available products include a pressure sensitive adhesive sheet (such as PD-S1) manufactured by PANAC Corporation, and pressure sensitive adhesive sheets of MHM series manufactured by NICHIEI KAKOH CO., LTD.

The thickness of the layer formed of the adhesive composition is preferably 0.1 µm to 10 µm and more preferably 0.5 µm to 5.0 µm.

The modulus of elasticity of the layer formed of the adhesive is preferably 0.001 GPa to 50 GPa and more preferably 0.01 GPa to 10 GPa.

As described above, the layer formed of the adhesive may not have the modulus of elasticity and the thickness satisfying Expression 1 but it is preferable that the layer has the modulus of elasticity and the thickness satisfying Expression 1.

<Application of Composite Film: Organic Electroluminescence Device>

The application of the composite film according to the embodiment of the present invention is not particularly limited and for example, the composite film can be preferably used in an image display device. The composite film according to the embodiment of the present invention can be used particularly in an organic electroluminescence device and can protect an organic electroluminescent element, which can be aged by the action of water, oxygen, and the like in use at normal temperature and normal pressure, from deterioration by sealing the organic electroluminescent element. In addition, the composite film according to the embodiment of the present invention can impart an antireflection function or the like to the organic electroluminescence device corresponding to the optical functional film such as the phase difference layer or the laminate of the phase difference layer and the polarizer layer thereof.

The organic electroluminescence device generally has a structure including a substrate, an organic electroluminescent element, and a sealing substrate in this order in the thickness direction of the substrate. In the present specification, the organic electroluminescence device may be referred to as an "organic EL device" and the organic electroluminescent element may be referred to as an "organic EL element".

The composite film may be used in the substrate or the sealing substrate and is preferably used in the sealing substrate.

The configuration of the organic electroluminescence device is not particularly limited and a top emission type organic electroluminescence device is preferable. An organic electroluminescence device which is a top emission type organic electroluminescence device and in which the sealing substrate is the composite film according to the embodiment of the present invention is particularly preferable.

In the organic electroluminescence device, the composite film may be arranged such that the inorganic layer is provided on the organic electroluminescent element side of the substrate. By arranging the inorganic layer to be closer to the organic electroluminescent element side, it is easy to prevent moisture from entering, and the durability of the organic electroluminescent element can be increased. Specifically, the phase difference layer, the substrate, the inorganic layer, and the organic electroluminescent element may be arranged in this order, or the substrate, the inorganic layer, the phase difference layer, and the organic electroluminescent element may be arranged in this order. By arranging the substrate, the inorganic layer, the phase difference layer, and the organic electroluminescent element in this order, it is also possible to prevent the deterioration of the function of the phase difference layer caused by moisture. For example, in a case of using the composite film further including the polarizer layer as an antireflection layer, the polarizer layer, the substrate, the inorganic layer, the phase difference layer, and the organic electroluminescent element are arranged in this order, or the substrate, the inorganic layer, the polarizer layer, the phase difference layer, and the organic electroluminescent element are arranged in this order, so that the antireflection function can be prevented from being deteriorated. In the latter case, the surface of the substrate opposite to the inorganic layer may include a functional layer such as a surface antireflection layer, an antifouling layer, a hard coat layer, and an antibacterial layer.

For example, the organic electroluminescence device can be generally prepared by (1) forming an organic electroluminescent element at the center of one surface of the substrate (one surface of the substrate on which the organic electroluminescent element is formed may be referred to as a "surface" in the present specification); (2) applying or bonding a sealant to at least the periphery of the organic electroluminescent element on the surface of the substrate obtained from (1); and (3) bonding the sealing substrate and the substrate using the sealant. That is, for example, an organic electroluminescent element is formed at the center of the substrate surface, then a sealant is applied to the outer side of the organic electroluminescent element on the surface so as to completely surround the organic electroluminescent element, and finally, the sealing substrate is bonded to the substrate using the sealant from the surface side with respect to the substrate to make sealing possible.

[Substrate and Sealing Substrate]

As described above, the composite film according to the embodiment of the present invention is used in the substrate or the sealing substrate of the organic electroluminescence device. The substrate or the sealing substrate in which the composite film according to the embodiment of the present invention is not used is not particularly limited and can be appropriately selected according to the purpose. Examples thereof include inorganic materials such as yttria-stabilized zirconia (YSZ) and glass (such as alkali-free glass and soda lime glass), polyester resins such as polyethylene terephthalate (PET) and polyethylene naphthalate (PEN), polycarbonate, polyimide resins (PI), polyethylene, polyvinyl chloride, polyvinylidene chloride, polystyrene, a styrene-acrylonitrile copolymer, and a cycloolefin polymer. These may be used alone or in combination of two or more kinds thereof. In a case of being used as the substrate, polyimide (PI) is preferable from the viewpoint of heat resistance, and in a case of being used as the sealing substrate, from the viewpoint of coating suitability with a roll, a polyester resin is preferable, and polyethylene terephthalate (PET) and polyethylene naphthalate (PEN) are particularly preferable. Also, from the viewpoint of optical properties, a cycloolefin polymer, polycarbonate and the like are particularly preferable.

The substrate is particularly preferably a film having heat resistance (for example, a polyimide film). It is preferable that both the substrate and the sealing substrate have flexibility.

A known gas barrier film may be used as the substrate or the sealing substrate. It is also preferable to use a gas barrier film in which the above-mentioned inorganic layer or barrier laminate is formed on the surface of the above-mentioned substrate as a gas barrier film.

In the organic electroluminescence device, the substrate is preferably a film having gas barrier properties, and the sealing substrate is preferably the composite film according to the embodiment of the present invention.

The surface of the substrate or the sealing substrate is preferably subjected to a surface activation treatment in order to improve adhesiveness with a light diffusion layer provided thereon. Examples of the surface activation treatment include a glow discharge treatment and a corona discharge treatment.

The substrate or the sealing substrate may be appropriately synthesized or a commercially available product may be used.

The thickness of the substrate or sealing substrate is not particularly limited and can be appropriately selected according to the purpose. The thickness thereof is preferably 1 μm or more and more preferably 10 μm or more. In addition, the thickness is preferably 500 μm or less, more preferably 300 μm or less, and even more preferably 150 μm or less.

[Organic Electroluminescent Element]

The organic electroluminescent element includes an electrode which becomes a cathode and an electrode which becomes an anode, and further includes an organic electroluminescent layer between the two electrodes.

The organic electroluminescent layer means a layer that has at least a light emitting layer, and may further include, as functional layers, in addition to the light emitting layer, respective layers such as a hole transport layer, an electron transport layer, a hole blocking layer, an electron blocking layer, a hole injection layer, and an electron injection layer. The thickness of each of the hole transport layer and the electron transport layer is preferably 500 nm or less from the viewpoint of charge transportability and cost.

In the organic electroluminescence device having the composite film according to the embodiment of the present invention as the sealing substrate, one of the electrodes on the substrate side may be a reflecting electrode that also functions as a reflective layer. In addition, the other electrode on the sealing substrate side is preferably a transparent electrode.

Known materials can be used as materials for preparing the organic electroluminescent layer, each layer in the organic electroluminescent layer, and each electrode, and for example, the description in paragraph 0069 of JP2016-162485A can be referred to.

[Sealing of Substrate and Sealing Substrate]

An ultraviolet curable resin is preferable as the sealant for bonding the substrate and the sealing substrate, and examples of the sealant include an ultraviolet curable epoxy resin and an ultraviolet curable acrylate resin. For example, XNR5516Z manufactured by Nagase ChemteX Corporation may be used.

In addition, a sealing film may be used as the sealant. As the sealing film, a thin sealing film is preferable. Generally, an adhesive sheet known as an optical clear adhesive (OCA) may be used. A sealing film having both adhesiveness and gas barrier properties is more preferable. As an example of a commercially available sealing film, 61562 of TESA tape Inc. can be mentioned.

EXAMPLES

The present invention is described with greater specificity below through Examples. The materials, amounts used, ratios, processing contents, processing procedures, and the like that are indicated in the Examples below can be suitably modified without departing from the spirit of the present invention. Accordingly, the scope of the present invention is not limited by the specific examples given below.

<<Preparation of Films of Examples 1 to 11 and Comparative Examples 1 to 4>>

The layer configurations shown in Table 1 was prepared.

The preparation method and the lamination method of each layer are as follows.

TABLE 1

| Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|
|  |  |  | Polarizer layer A |  |  |  |  |  | λ/2 layer A (OCA 25μ) |  |
|  | λ/2 layer A | Polarizer layer A | λ/2 layer A |  |  |  |  |  | λ/4 layer A | λ/4 layer B |
| λ/4 | λ/4 | λ/4 | λ/4 layer A | Polarizer | Polarizer | Polarizer |  |  | (OCA 25μ) | +C-plate |

TABLE 1-continued

| layer B COP substrate Barrier laminate A | layer A COP substrate Barrier laminate A | layer B COP substrate Barrier laminate A | COP substrate Barrier laminate A | layer A COP substrate Barrier laminate A λ/4 layer B | layer A COP substrate Barrier laminate A λ/4 layer B | layer A COP substrate Barrier laminate A λ/2 layer A λ/4 layer A | PET substrate Barrier laminate A Polarizer layer A λ/4 layer B | PET substrate Barrier laminate A Polarizer layer A λ/2 layer A λ/4 layer A | COP substrate Barrier laminate A | COP substrate Barrier laminate B |
|---|---|---|---|---|---|---|---|---|---|---|
| Comparative Example 1 | | | Comparative Example 2 | | | Comparative Example 3 | | | Comparative Example 4 | |
| PET substrate Barrier layer C Polarizer layer B λ/2 layer A λ/4 layer A | | | TAC substrate Polarizer layer C λ/4 layer C Barrier layer C | | | TAC Polarizer layer C (OCA 25μ) λ/2 layer A λ/4 layer A COP substrate Barrier laminate A | | | λ/2 layer A (OCA 50μ) λ/4 layer A (OCA 50μ) COP substrate Barrier laminate A | |

<Substrate>

A cycloolefin polymer (COP) substrate was prepared by a solution film forming method using a cyclic polyolefin resin (manufactured by ARTON, JSR CORPORATION). A coating liquid was prepared by mixing the following composition while stirring.

TABLE 2

| ARTON-G7810 | 100 parts by mass |
| Methylene chloride | 300 parts by mass |
| Ethanol | 40 parts by mass |

The prepared coating liquid was uniformly cast on a stainless steel band support at a temperature of 22° C. using a belt casting device. On the stainless steel band support, the solvent was evaporated until the residual solvent content became 100%, and the cast film was peeled from the stainless steel band support by a peeling roll at a peeling tension of 180 N/m. The peeled cast film was stretched in a machine direction (MD direction:flow direction) at a transport tension of 180 N/m while holding the film at 60° C. The stretching ratio in the MD direction at this time was 10%. Next, the film was dried at 195° C. while stretching the film by 25% in the width direction with a tenter. Finally, the film was dried while being transported at 120° C. and a transport tension of 100 N/m to obtain a COP substrate having a thickness of 40 μm.

As a polyethylene terephthalate (PET) substrate, A4300 (having a thickness of 50 μm) manufactured by Toyobo Co., Ltd. was used.

<Inorganic Layer>

(Barrier Laminate A)

Trimethylolpropane triacrylate (TMPTA; manufactured by Daicel Cytec Co., Ltd.), a silane coupling agent (KBM-5103, manufactured by Shin-Etsu Chemical Co., Ltd.) and a polymerizable acidic compound (KARAMER PM-21, manufactured by Nippon Kayaku Co., Ltd.) were mixed at a mass ratio of 14.1:3.5:1 to prepare a composition.

18.6 g of the composition, 1.4 g of an ultraviolet polymerization initiator (ESACURE KTO46, manufactured by Lamberti S.p.A.), and 180 g of 2-butanone were mixed to prepare a composition for forming an organic layer.

The composition for forming an organic layer was applied to the surface of the prepared substrate. The composition for forming an organic layer was applied by using a wire bar and the thickness of the coating film was 20 μm.

After the composition for forming an organic layer was applied, the composition for forming an organic layer was dried by being left to stand at room temperature.

Next, the composition for forming an organic layer was cured by irradiation with the ultraviolet ray of a high pressure mercury lamp in a chamber with an oxygen concentration of 0.1% using a nitrogen substitution method (cumulative irradiation dose: approximately 1 J/cm$^2$), and thus an organic layer having a thickness of 4000 nm±50 nm was formed on the surface of the substrate.

A silicon nitride film having a thickness of 30 nm was formed on the surface of the formed organic layer as an inorganic layer.

The inorganic layer (silicon nitride film) was formed by using a general capacitively coupled plasma method (CCP)-CVD device. As raw material gases, silane gas (flow rate: 160 sccm), ammonia gas (flow rate: 370 sccm), hydrogen gas (flow rate: 590 sccm), and nitrogen gas (flow rate: 240 sccm) were used. The film forming pressure was set to 40 Pa. A power source of high frequency of 13.56 MHz frequency was used as a power source, and the plasma excitation power was set to 2.5 kW.

An organic layer/inorganic layer laminate was laminated on the prepared organic layer/inorganic layer laminate in the same process as described above except that the composition for forming an organic layer was further applied at a thickness of 2000 nm±50 nm.

As described above, a barrier laminate A having two combinations of an organic layer and an inorganic layer such that the organic layer was provided on the substrate and the inorganic layer was provided on the organic layer was prepared.

(Barrier Laminate B)

A barrier laminate B having one organic layer/inorganic layer combination was prepared in the same process as described above except that the thickness of the organic layer was set to 1000 nm±50 nm.

(Barrier Layer C)

A SiO$_2$ film was formed on the surface of a λ/4 layer B at a thickness of 150 nm using a sputtering method and used as a barrier layer C. The film formation was performed under the conditions that the flow rate of argon gas was 40 sccm, the RF power was 250 W, and the vacuum degree was $7.5 \times 10^{-1}$ Pa.

<Adhesive Composition>

In the films of Examples and Comparative Examples, both of the phase difference layer and the polarizer layer (polarizer layer A and polarizer layer B) were formed on the peelable support and then laminated by using transfer. At the time of transfer, the adhesive composition having the composition shown in Table 3 below was used. The adhesive composition was applied to the laminated surface by using a #2 wire bar so as to have a thickness of 1 μm after curing, and then the phase difference layer and the polarizer layer were bonded. Subsequently, the adhesive composition was cured by irradiation with ultraviolet rays at an integrated amount of exposure of 6000 mJ/cm$^2$. Then, the peelable support was peeled off to obtain a laminate.

TABLE 3

Composition of adhesive composition

| | |
|---|---|
| Urethane acrylate oligomer | 10 parts by mass |
| Pentaerythritol triacrylate | 90 parts by mass |
| Diphenyl(2,4,6-trimethoxybenzoyl)phosphine oxide | 6 parts by mass |

However, in lamination of the polarizer layer C and the λ/2 layer A of the film of Comparative Example 3, OCA (8146-1 manufactured by 3M Co., Ltd.) was used. In addition, in lamination of the COP substrate and the λ/4 layer A, and the λ/4 layer A and the λ/2 layer A in the Comparative Example 4, OCA (8146-2 manufactured by 3M Co., Ltd.) was used.

<Phase Difference Layer>

(λ/2 Layer A)

The λ/2 layer A was prepared in the following procedures (1) to (3).

(1) Alkali Saponification Treatment of Cellulose Acetate Film

A cellulose acetate film was allowed to pass through a dielectric heating roll at a temperature of 60° C. to increase the film surface temperature to 40° C. Subsequently, an alkaline solution having the composition shown in Table 4 below was applied to the band surface of this film using a bar coater in a coating amount of 14 mL/m$^2$, and the film was transported under a steam type far infrared heater (manufactured by Noritake Co., Ltd.) heated to 110° C. for 10 seconds. Next, 3 mL/m$^2$ of pure water was similarly applied to the film using the bar coater. Next, after repeating rinsing using a fountain coater and draining using an air knife three times, the film was transported to a drying zone at 70° C. for 10 seconds and dried to perform an alkali saponification treatment.

TABLE 4

Composition of alkaline solution

| | |
|---|---|
| Potassium hydroxide | 4.7 parts by mass |
| Water | 15.8 parts by mass |
| Isopropanol | 63.7 parts by mass |
| Surfactant SF-1: $C_{14}H_{29}O(CH_2CH_2O)_{20}H$ | 1.0 part by mass |
| Propylene glycol | 14.8 parts by mass |

(2) Formation of Alignment Film

An alignment film coating liquid having the composition shown in Table 5 below was continuously applied to the saponified long cellulose acetate film (peelable support) using a #14 wire bar. The coating liquid was dried for 60 seconds with hot air at 60° C. and further dried for 120 seconds with hot air at 100° C. The obtained alignment film was subjected to a rubbing treatment continuously. At this time, the longitudinal direction of the long film was parallel to the transport direction. The angle formed between the longitudinal direction of the film and the rotation axis of the rubbing roller was adjusted to any of 15°, 45°, or 75°. The thickness of the prepared alignment film was 0.5 μm.

TABLE 5

Composition of alignment film coating liquid

| | |
|---|---|
| Modified polyvinyl alcohol (Compound below) | 10 parts by mass |
| Water | 371 parts by mass |
| Methanol | 119 parts by mass |
| Glutaraldehyde | 0.5 parts by mass |
| Photopolymerization initiator (IRGACURE 2959, manufactured by BASF SE) | 0.3 parts by mass |

$$-\!\!\left(CH_2\ CH\right)_{\overline{86.3}}\!\!\left(CH_2\ CH\right)_{\overline{12}}\!\!\left(CH_2\ CH\right)_{\overline{1.7}}\!\!-\qquad CH_3$$
$$\quad\quad\quad OH\quad\quad\ OCOCH_3\quad OCONHCH_2CH_2OCOC\!=\!CH_2$$

(3) Layer Formation (Coating and Curing)

A coating liquid including a disk-like liquid crystal compound shown in Table 6 below was continuously applied to the surface of the alignment film prepared above with a wire bar. The film transport speed was set to 36 m/min. For drying of the solvent of the coating liquid and alignment and aging of the disk-like liquid crystal compound, the coating liquid was heated for 90 seconds with hot air at 120° C. Subsequently, UV irradiation was performed at 80° C. to fix the alignment of the liquid crystal compound. The thickness of the layer was adjusted to 3.6 μm and thus a λ/2 layer A having an Re(550) of 270 nm was obtained.

TABLE 6

Composition of composition including disk-like liquid crystal compound (coating liquid)

| | |
|---|---|
| Disk-like liquid crystal compound 1 | 91 parts by mass |
| Acrylate monomer 1 (Ethylene oxide-modified trimethylolpropane triacrylate (V#360, manufactured by OSAKA ORGANIC CHEMICAL INDUSTRY LTD.) | 5 parts by mass |
| Photopolymerization initiator (IRGACURE 907, manufactured by BASF SE) | 3 parts by mass |
| Sensitizer (KAYACURE DETX, manufactured by Nippon Kayaku Co., Ltd.) | 1 part by mass |
| Pyridinium salt 1 | 0.5 parts by mass |
| Fluorine-based polymer 1 | 0.2 parts by mass |

TABLE 6-continued

Composition of composition including disk-like liquid crystal compound (coating liquid)

| | |
|---|---|
| Fluorine-based polymer 2 | 0.1 parts by mass |
| Methyl ethyl ketone | 189 parts by mass |

Disk-like liquid crystal compound 1

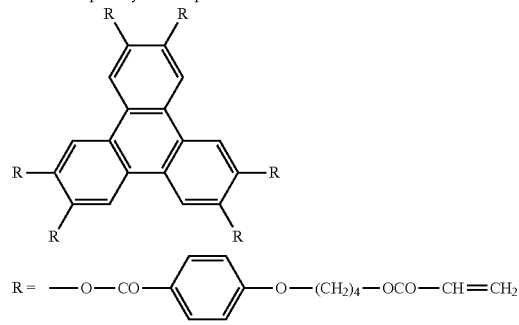

R = —O—CO—⟨⟩—O—(CH₂)₄—OCO—CH=CH₂

Pyridinium salt 1

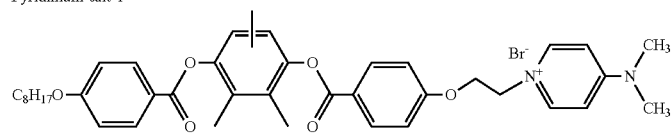

Fluorine-based polymer 1

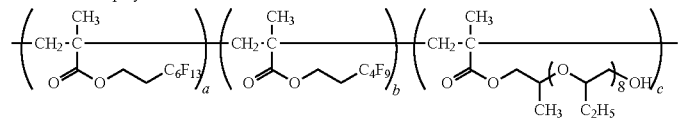

a/b/c = 20/20/60 wt %
Mw = 16000

Fluorine-based polymer 2

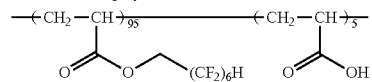

Mw = 17000

(λ/4 Layer A)

The same materials and procedures as in the preparation of the λ/2 layer A were used and the thickness of the layer was adjusted to 1.8 μm to obtain a λ/4 layer A having an Re(550) of 135 nm.

(λ/4 Layer B)

An alignment film was prepared in the same procedures as in the preparation of the λ/2 layer A. A coating liquid including a rod-like liquid crystal compound of the following table was continuously applied to the surface of the alignment film prepared above with a wire bar. The film transport speed was set to 36 m/min. For drying of the solvent of the coating liquid and alignment and aging of the rod-like liquid crystal compound, the coating liquid was heated for 120 seconds with hot air at 70° C. Subsequently, UV irradiation was performed at 40° C. to fix the alignment of the liquid crystal compound. The thickness of the layer was adjusted to 1.2 μm and thus a λ/4 layer B having an Re(550) of 118 nm was obtained.

TABLE 7

| | |
|---|---|
| Rod-like liquid crystal compound 1 | 100 parts by mass |
| Photopolymerization initiator (IRGACURE 907, manufactured by BASF SE) | 3 parts by mass |
| Sensitizer (KAYACURE DETX, manufactured by Nippon Kayaku Co., Ltd.) | 1 part by mass |
| Leveling agent 1 | 0.8 parts by mass |
| Leveling agent 2 | 0.05 parts by mass |
| Acrylate monomer 1 | 5 parts by mass |

Rod-like crystal compound 1

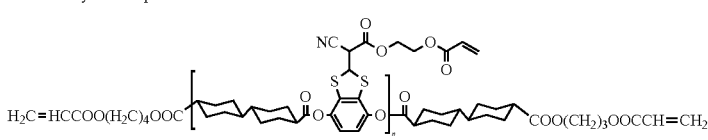

TABLE 7-continued

Cry-110° C.-N-250° C. or higher-Iso
Leveling agent 1

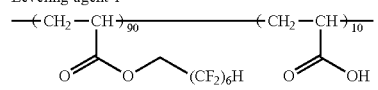

Leveling agent 2

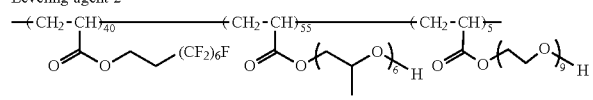

(λ/4 Layer C)

A commercially available long norbornene-based resin film (ZEONOR, manufactured by Nippon Zeon Co., Ltd.) having a thickness of 50 μm was stretched by 1.52 times to obtain a λ/4 layer C having an Re(550) of 140 nm and a thickness of 35 μm.

(Positive C-Plate)

A cellulose acetate film was subjected to an alkali saponification treatment in the same manner as in the preparation of the λ/2 layer A. An alignment film coating liquid having the following composition was continuously applied to this substrate with a #8 wire bar, and the coated surface was dried for 60 seconds at 60 degrees and further dried for 120 seconds with hot air at 100° C. to form an alignment film. A rubbing treatment was performed on the surface of the formed alignment film.

TABLE 8

| Modified polyvinyl alcohol below | 2.4 parts by mass |
| Isopropyl alcohol | 1.6 parts by mass |
| Methanol | 36 parts by mass |
| Water | 60 parts by mass |

Modified polyvinyl alcohol

TABLE 8-continued

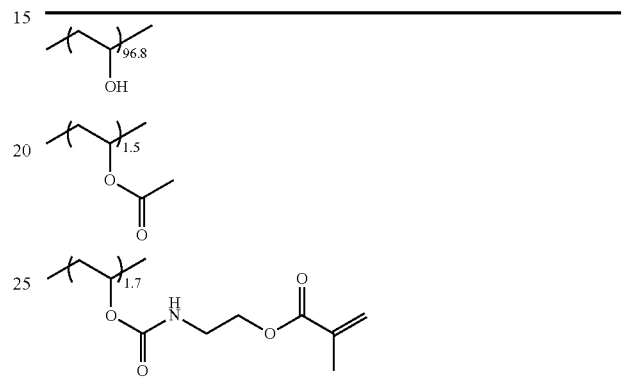

A coating liquid including a rod-like liquid crystal compound shown in the following table was continuously applied to the surface of the alignment film prepared above with a wire bar. For drying of the solvent of the coating liquid and alignment and aging of the rod-like liquid crystal compound, the coating liquid was heated for 60 seconds with hot air at 60° C. Subsequently, UV irradiation was performed to fix the alignment of the liquid crystal compound. The thickness of the layer was adjusted to 1.5 μm and thus a positive C-plate of homeotropic alignment was obtained.

| Rod-like liquid crystal compound 2 | 80 parts by mass |
| Rod-like liquid crystal compound 3 | 20 parts by mass |
| Vertical alignment agent 1 | 1 part by mass |
| Vertical alignment agent 2 | 0.5 parts by mass |
| Acrylate monomer 1 | 8 parts by mass |
| Photopolymerization initiator (IRGACURE 907, manufactured by BASF SE) | 3 parts by mass |
| Sensitizer (KAYACURE DETX, manufactured by Nippon Kayaku Co., Ltd.) | 1 part by mass |
| Leveling agent 1 | 0.4 parts by mass |
| Methyl ethyl ketone | 170 parts by mass |
| Cyclohexanone | 30 parts by mass |

Rod-like liquid crystal compound 2

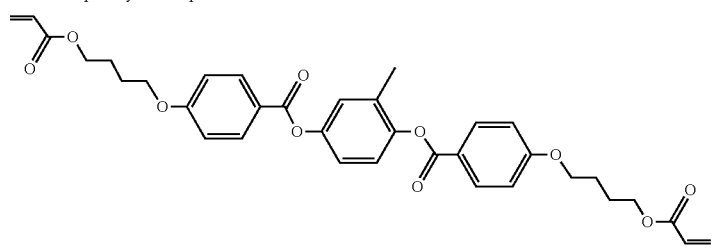

Rod-like liquid crystal compound 3

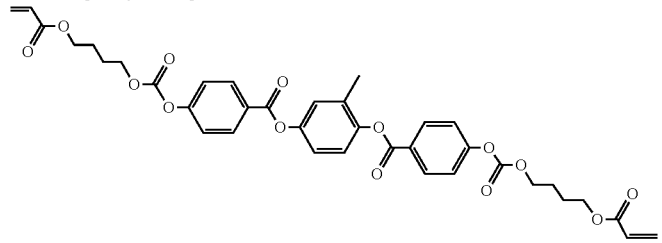 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

Vertical alignment agent 1

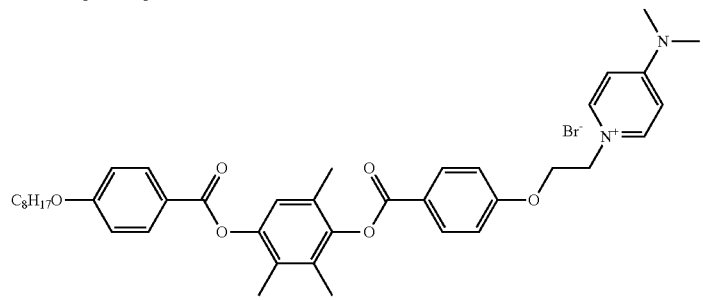

Vertical alignment agent 2

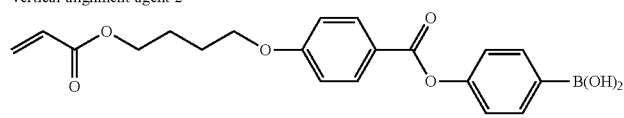

<Polarizer Layer>

(Polarizer Layer A)

An alignment film 1a was formed on the surface of a commercially available polyimide film using an alignment film 1 forming coating liquid having the same composition as that of the positive C-plate, and the surface of the alignment film 1a was further subjected to a rubbing treatment.

A coating liquid 1 for a dichroic dye polarizer having the following composition was prepared.

| Composition of coating liquid 1 for dichroic dye polarizer | |
|---|---|
| Dichroic dye PB-7 | 50 parts by mass |
| Dichroic dye C-3 | 30 parts by mass |
| Dichroic dye C-19 | 20 parts by mass |
| Fluorine-containing compound C | 0.3 parts by mass |
| Chloroform | 1130 parts by mass |

Dichroic dye PB-7

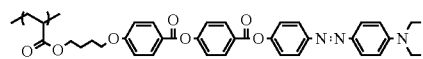

Dichroic dye C-3

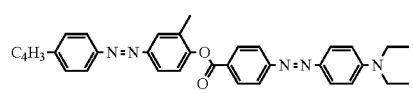

Dichroic dye C-19

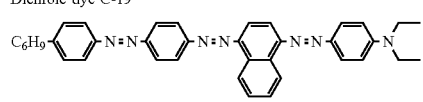

Fluorine-containing compound C

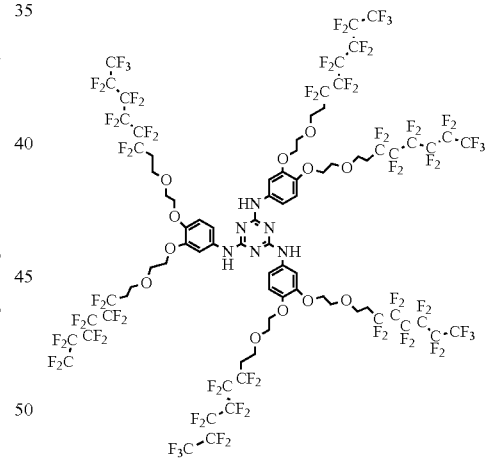

On the surface of the alignment film 1a subjected to the rubbing treatment, the coating liquid 1 for a dichroic dye polarizer was cast for 10 seconds using a spin coater at 2000 rpm.

Next, after aging for 15 seconds in a state in which the temperature of the coating film was maintained at 160° C., the film was cooled to room temperature to form a polarizer layer A on the alignment film 1a. The thickness of the formed polarizer layer A was 1.5 μm and the absorption axis was aligned to be parallel to the rubbing direction.

(Polarizer Layer B)

A solution of PVA (NH26, manufactured by The Nippon Synthetic Chemical Industry Co., Ltd.) was applied to a PET film (NOVACLEAR, manufactured by Mitsubishi Plastics, Inc.) having a thickness of 100 µm as a temporary support and dried. The thickness of the PVA layer after drying was 10 µm. The layer was dyed in an aqueous solution containing iodine and then was uniaxially stretched about 5 times between rolls having different speed ratios in an aqueous solution containing boric acid to obtain a long polarizer having a thickness of 2 µm. The ratio K/I of iodine concentration (% by mass) to potassium concentration (% by mass) in the polarizer was 0.402. The temporary support and the PVA layer were taken out from the aqueous solution containing boric acid, and dried with hot air to obtain a polarizer layer B.

surement substrate) shown in Table 10. In addition, the modulus of elasticity of the inorganic layer A of the barrier laminate was measured by a picosecond ultrasonic method. The results are shown in Table 10.

<Layer Thickness>

A layer thickness of 10 µm or more was measured using a micrometer (manufactured by Mitutoyo Corporation). A layer thickness of less than 10 µm was measured by cutting out the cross section and performing measurement using a scanning electron microscope (manufactured by Hitachi High-Technologies Corporation). The results are shown in Table 10.

TABLE 10

| | Barrier laminates A and B | | | | | | | | | | |
|---|---|---|---|---|---|---|---|---|---|---|---|
| | Organic layer | Inorganic layer | Barrier layer C | λ/2 layer A | λ/4 layer A | λ/4 layer B | λ/4 layer C | Positive C-plate | Polarizer layer A | Polarizer layer B | Polarizer layer C |
| Modulus of elasticity E (Gpa) | 4.2 | 150 | 70 | 3.9 | 3.9 | 3.9 | 4.6 | 3.9 | 10.1 | 4.6 | 4.6 |
| (Measurement substrate) | Glass | COP film | Glass | TAC film | TAC film | TAC film | None | TAC film | Glass | PET film | TAC film |
| Thickness t (µm) | 1 to 4 | 0.03 | 0.15 | 3.6 | 1.8 | 1.2 | 35 | 1.5 | 0.85 | 2.0 | 30 |

| | | COP | PET | TAC |
|---|---|---|---|---|
| Modulus of elasticity E (Gpa) | | 3.9 | 4.3 | 3.2 |
| Thickness t (µm) | | 40 | 23 | 80 |

(Laminate of Polarizer Layer C and Substrate TAC)

A commercially available polyvinyl alcohol film (VF-PS, manufactured by Kuraray Co., Ltd.) was dyed in an aqueous solution containing iodine, and then was uniaxially stretched about 6 times between rolls having different speed ratios in an aqueous solution containing boric acid to obtain a long polarizer C having a thickness of 30 µm. The ratio K/I of iodine concentration (% by mass) to potassium concentration (% by mass) in the polarizer C was 0.402. A TAC film (TD80UL, manufactured by Fujifilm Corporation) having a thickness of 80 µm as a protective film was bonded to one surface of the polarizer C using a polyvinyl alcohol-based adhesive to obtain a laminate of TAC (substrate) and the polarizer layer C.

<Lamination Method of Film>

In Examples 1 to 9, and 11, and Comparative Examples 1 and 2, the λ/2 layer A, the λ/4 layers A, B, and C, the polarizer layers A, B, and C, and the positive C-plate were laminated using the adhesive composition. In Example 10, the λ/2 layer A and the λ/4 layer A were laminated using OCA (8146-1, manufactured by 3M Co., Ltd.). In addition, in Comparative Example 3, the λ/2 layer A and the λ/4 layer A were laminated using the adhesive composition but the polarizer layer C was laminated using the OCA. In Comparative Example 4, the λ/2 layer A and the λ/4 layer A were laminated using the OCA.

<Modulus of Elasticity>

The modulus of elasticity of each layer was evaluated using a nanoindentation method (using a micrometer manufactured by Hysitron Inc.). The modulus of elasticity of a film-like single layer that could be taken out as an independent film was measured and the modulus of elasticity of a layer that could not be taken out as an independent film was measured in a state of being formed on a substrate (mea-

TABLE 11

| | Distance between substrate and surface (upper side in Table 1) µm | Distance between substrate and surface (lower side in Table 1) µm | Minimum value of E × t × l | SUM (E × t × l) |
|---|---|---|---|---|
| Example 1 | 2.2 | 6.1 | 18.1 | 129 |
| Example 2 | 7.4 | 6.1 | 18.1 | 213 |
| Example 3 | 4.1 | 6.1 | 18.1 | 160 |
| Example 4 | 9.3 | 6.1 | 18.1 | 289 |
| Example 5 | 1.9 | 6.1 | 18.1 | 133 |
| Example 6 | 1.9 | 8.3 | 18.1 | 169 |
| Example 7 | 1.9 | 13.5 | 18.1 | 346 |
| Example 8 | 0 | 10.1 | 18.1 | 221 |
| Example 9 | 0 | 15.3 | 18.1 | 411 |
| Example 10 | 55.4 | 13.1 | 36.1 | 1392 |
| Example 11 | 2.4 | 1.0 | 2.10 | 31 |
| Comparative Example 1 | 0 | 10.6 | 0.79 | 142 |
| Comparative Example 2 | 0 | 66.2 | 168 | 10046 |
| Comparative Example 3 | 142.4 | 6.1 | 18.1 | 32955 |
| Comparative Example 4 | 55.4 | 13.1 | 36.1 | 1918 |

<<Evaluation of Films of Examples 1 to 11 and Comparative Examples 1 to 4>>

The evaluation was made according to the following procedures and standards. The results are shown in Table 12.

[Evaluation of Flexibility]

The flexibility of each composite film was evaluated using the mandrel method according to JIS K 5600-5-1 based on the following standards.

A: No peeling or breakage or film damage occurred even in a case where the mandrel radius was less than 5 mm and the film was bent 1000 times or more.

B: No peeling or breakage or film damage occurred even in a case where the mandrel radius was in a range of than 5 mm or more and less than 10 mm and the film was bent 1000 times or more.

C: No peeling or breakage or film damage occurred even in a case where the mandrel radius was 10 mm or more and the film was bent 1000 times or more.

[Durability of Organic EL Element]

An organic EL element was prepared according to the method described in JP2016-162485A. An UV curable epoxy-based adhesive (XNR5516Z, Nagase ChemteX Corporation) was applied to the entire surface close to the barrier surface (barrier layer) of the composite film using a dispenser (SHOT mini 200SX, manufactured by Musashi Engineering, Inc.). The light extraction side of the organic EL element and the adhesive-applied surface of the composite film were arranged to face each other and bonded in a glove box (GB). Then, UV light of 365 nm was applied in an integrated amount of light of 6,000 mJ/cm$^2$, and the adhesive was cured. The element was stored under moisture heat conditions of 60° C. and the occupancy ratio of dark spots with respect to the entire light emission area 90% after 100 hours was calculated. The durability of the organic EL element was evaluated by providing the following standards.

A: The occupancy ratio of dark spots was less than 5%.

B: The occupancy ratio of dark spots was 5% or more and less than 20%.

C: The occupancy ratio of dark spots was 20% or more.

TABLE 12

|  | Flexibility | Durability of organic EL |
| --- | --- | --- |
| Example 1 | A | A |
| Example 2 | A | A |
| Example 3 | A | A |
| Example 4 | A | A |
| Example 5 | A | A |
| Example 6 | A | A |
| Example 7 | B | A |
| Example 8 | B | A |
| Example 9 | B | A |
| Example 10 | B | A |
| Example 11 | A | A |
| Comparative Example 1 | A | C |
| Comparative Example 2 | C | C |
| Comparative Example 3 | C | A |
| Comparative Example 4 | C | A |

From the above results, it is found that the existence of a layer having a small thickness and a low modulus of elasticity decreases the minimum value of E×t×1, and the barrier properties are deteriorated to deteriorate the durability of the organic EL (Comparative Example 1). In addition, it is found that in a case where there is a layer having a large thickness and a large distance to the substrate, the value of SUM(E×t×1) is increased and the flexibility is deteriorated (Comparative Examples 2 and 3). As seen from Comparative Example 4, even in a case of using a thin layer, the distance to the substrate is increased by forming a thick adhesive composition layer and then laminating the layer, and the value of SUM(E×t×1) is increased to deteriorate the flexibility.

What is claimed is:

1. A composite film comprising:
at least one phase difference layer;
a substrate; and
an inorganic layer,
wherein the phase difference layer is a layer formed by curing a composition including a liquid crystal compound,
the inorganic layer includes silicon nitride,
a distance between the substrate and a surface of the composite film is 60 μm or less, and
with respect to each of the layers other than the substrate, a product E×t×1 of a modulus of elasticity E in unit of GPa, a thickness t in unit of μm, and a distance 1 from a surface of the substrate to a center of each of the layer in unit of μm satisfies Expression 1, and a total SUM (E×t×1) of E×t×1 of each of the layers other than the substrate satisfies Expression 2

$$0.8 \le E \times t \times 1 \qquad \text{Expression 1}$$

$$\text{SUM}(E \times t \times 1) \le 1500 \qquad \text{Expression 2.}$$

2. The composite film according to claim 1, further comprising:
an organic layer,
wherein the inorganic layer is in direct contact with the organic layer.

3. The composite film according to claim 2, wherein the inorganic layer is a layer formed on a surface of the organic layer by a chemical vapor deposition method.

4. The composite film according to claim 1, further comprising:
a polarizer layer,
wherein one phase difference layer and the polarizer layer are adjacent to each other.

5. The composite film according to claim 2, further comprising:
a polarizer layer,
wherein one phase difference layer and the polarizer layer are adjacent to each other.

6. The composite film according to claim 3, further comprising:
a polarizer layer,
wherein one phase difference layer and the polarizer layer are adjacent to each other.

7. The composite film according to claim 4, wherein the polarizer layer includes an organic dichroic dye.

8. The composite film according to claim 6, wherein the polarizer layer includes an organic dichroic dye.

9. The composite film according to claim 1, further comprising:
a λ/2 layer; and
a λ/4 layer,
wherein the λ/2 layer and the λ/4 layer are adjacent to each other.

10. The composite film according to claim 9, further comprising:
a λ/2 layer; and
a λ/4 layer,
wherein the λ/2 layer and the λ/4 layer are adjacent to each other.

11. The composite film according to claim 1, wherein the liquid crystal compound is a disk-like liquid crystal compound.

12. The composite film according to claim 10, wherein the liquid crystal compound is a disk-like liquid crystal compound.

13. The composite film according to claim 1,
wherein the substrate is a cycloolefin polymer film.
14. The composite film according to claim 12,
wherein the substrate is a cycloolefin polymer film.
15. The composite film according to claim 1,
wherein the at least one phase difference layer, the substrate, and the inorganic layer are arranged in this order.
16. The composite film according to claim 1,
wherein the at least one phase difference layer, the inorganic layer, and the substrate are arranged in this order.
17. An organic electroluminescence device comprising:
the composite film according to claim 1; and
an organic electroluminescent element,
wherein the at least one phase difference layer, the substrate, the inorganic layer, and the organic electroluminescent element are arranged in this order.
18. An organic electroluminescence device comprising:
the composite film according to claim 1; and
an organic electroluminescent element,
wherein the substrate, the inorganic layer, the at least one phase difference layer, and the organic electroluminescent element are arranged in this order.

* * * * *